(12) United States Patent
Potter et al.

(10) Patent No.: US 10,188,014 B2
(45) Date of Patent: Jan. 22, 2019

(54) LATCHING SYSTEM

(71) Applicant: Hewlett Packard Enterprise Development LP, Houston, TX (US)

(72) Inventors: Andrew Potter, Houston, TX (US); Troy A. Della Fiora, Spring, TX (US); Michael S. Bunker, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/535,027

(22) PCT Filed: Dec. 16, 2014

(86) PCT No.: PCT/US2014/070553
§ 371 (c)(1),
(2) Date: Jun. 9, 2017

(87) PCT Pub. No.: WO2016/099455
PCT Pub. Date: Jun. 23, 2016

(65) Prior Publication Data
US 2017/0332512 A1    Nov. 16, 2017

(51) Int. Cl.
| | |
|---|---|
| H05K 7/12 | (2006.01) |
| F16H 21/44 | (2006.01) |
| H05K 7/18 | (2006.01) |
| H05K 7/14 | (2006.01) |
| G06F 1/16 | (2006.01) |
| H05K 7/00 | (2006.01) |
| G06F 1/00 | (2006.01) |

(52) U.S. Cl.
CPC ............... *H05K 7/18* (2013.01); *G06F 1/16* (2013.01); *H05K 7/1402* (2013.01); *G06F 1/00* (2013.01); *H05K 7/00* (2013.01)

(58) Field of Classification Search
None
See application file for complete search history.

(56) References Cited

U.S. PATENT DOCUMENTS

| | | | |
|---|---|---|---|
| 6,155,853 A | * | 12/2000 | Kajiura ............... G06K 7/0047 439/159 |
| 6,229,708 B1 | | 5/2001 | Corbin |
| 6,290,136 B1 | | 9/2001 | Koseki |
| 6,490,153 B1 | | 12/2002 | Casebolt |
| 6,851,867 B2 | | 2/2005 | Pang |
| 6,966,703 B1 | | 11/2005 | Lebby |
| 6,992,886 B2 | | 1/2006 | Salinas et al. |
| 7,088,579 B1 | | 8/2006 | Konshak |
| 7,264,490 B1 | | 9/2007 | Reznikov |

(Continued)

OTHER PUBLICATIONS

PCT/ISAKR, International Search and Written Opinion, dated Aug. 31, 2015, PCT/US2014/070553.

*Primary Examiner* — Xanthia C Cunningham
(74) *Attorney, Agent, or Firm* — Hewlett Packard Enterprise Patent Department (57) ABSTRACT

In one example a latching system is disclosed. The latching system has a handle that moves along an axis of motion between three positions: a latched position, an unlatched position and an engaged position. The handle moves a retention clip from a locked position into an unlocked position when the handle moves from the unlatched position into the engaged position.

14 Claims, 7 Drawing Sheets

(56) References Cited

U.S. PATENT DOCUMENTS

| | | | |
|---|---|---|---|
| 7,510,415 B2 * | 3/2009 | Wang | H01R 13/635 |
| | | | 439/159 |
| 7,510,416 B2 * | 3/2009 | Sato | H05K 7/1409 |
| | | | 361/754 |
| 7,518,854 B2 | 4/2009 | Salinas | |
| 7,535,704 B2 | 5/2009 | Olesiewicz | |
| 7,573,726 B1 | 8/2009 | Cote et al. | |
| 2002/0104396 A1 | 8/2002 | Megason et al. | |
| 2011/0309730 A1 * | 12/2011 | Retchloff | E05B 65/46 |
| | | | 312/332.1 |
| 2012/0264338 A1 * | 10/2012 | Toki | H01R 25/145 |
| | | | 439/699.1 |

* cited by examiner

LATCHING SYSTEM

BACKGROUND

Computer severs typically have a plurality of different devices installed into mounts in a rack. The devices may be hard drives, memory cards, solid state memory, processor blades, Input/Output (I/O) cards, network cards or the like. Many of the devices can be added or replaced after the rack has been installed into a data center. Most of the devices use a latching system to hold the device into the mounts in the rack. The latching system typically will physically lock the device into the mount and may provide the correct amount of force to ensure that any electrical connectors on the device are properly inserted into the mating connectors in the mount. The latching system may also provide enough force to disengage the device from the mount when the device is removed.

DETAILED DESCRIPTION

As the size of devices that are mounted into servers becomes smaller, the space available for the latching systems used to hold them in place is also getting smaller. In addition many of the latching systems used a rotational or camming motion to latch and unlatch the device. Typically the rotational or camming motion required part of the latching system to extend beyond the front face of the device being held in place or to be attached to the front face of the device being held in place.

In one example, a latching system will use a linear motion of a handle to latch and unlatch the device. The handle will be recessed or flush with the front face of the device when the handle is in the fully latched position. The latching system will mount to the side of the device.

Figure 1A:
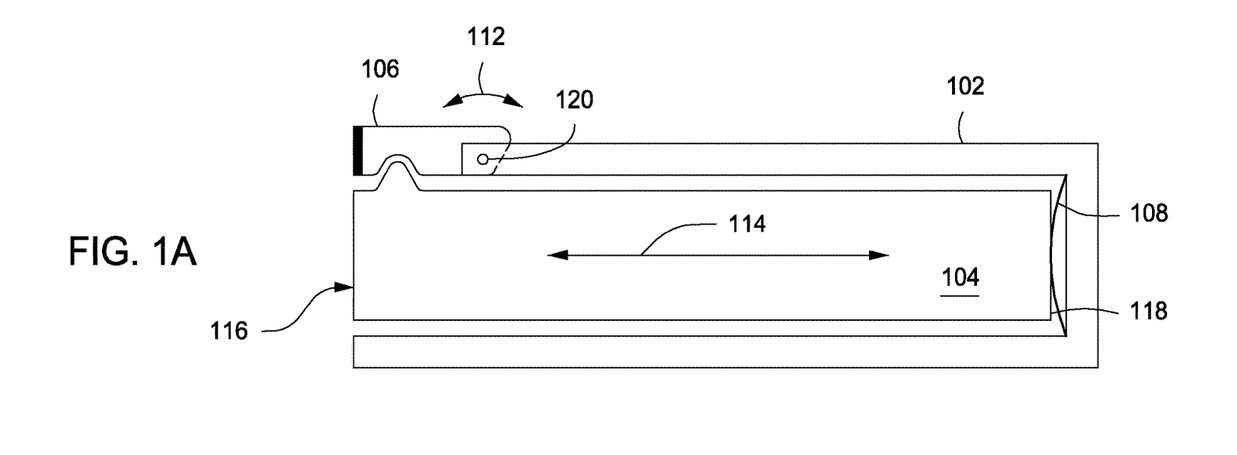
FIG. 1A is a sectional side view of an example latching system.

FIG. 1A is a sectional side view of an example latching system. The latching system comprises a frame 102, a handle 104, a handle latch 106, a retention clip 230 (see FIG. 2) and a leaf spring 108. The handle 104 is slidably mounted to the frame 102 and can move along an axis of motion (as shown by arrow 114). The handle can move between three positions along the axis of motion. The three positions, in order, are a latched position, an unlatched position and an engaged position. The handle is shown in the latched position in FIG. 1A.

When the handle 104 is in the latched position, the leaf spring 108 is compressed between the back end 118 of the handle 104 and the frame 102. In some examples, the front face 116 of the handle 104 is flush with the front face of the frame 102 when the handle 104 is in the latched position. In other examples the front face 116 of the handle 104 may be recessed into the frame 102 or extend slightly beyond the front face of the frame 102 when the handle 104 is in the latched position.

The handle latch 106 is mounted to the frame 102 and can rotate about axis 120 (as shown by arrows 112). The handle latch 106 can rotate between a first position and a second position. When the handle latch 106 is in the first position and the handle 104 is in the latched position, the handle latch 106 holds the handle 104 in the latched position (as shown in FIG. 1A). When the handle 104 is in the latched position and the handle latch is rotated into the second position, the handle 104 is released and the leaf spring 108 forces the handle 104 into the unlatched position. In this example a leaf spring is used, but other types of springs could be used, for example a compression spring.

Figure 1B:
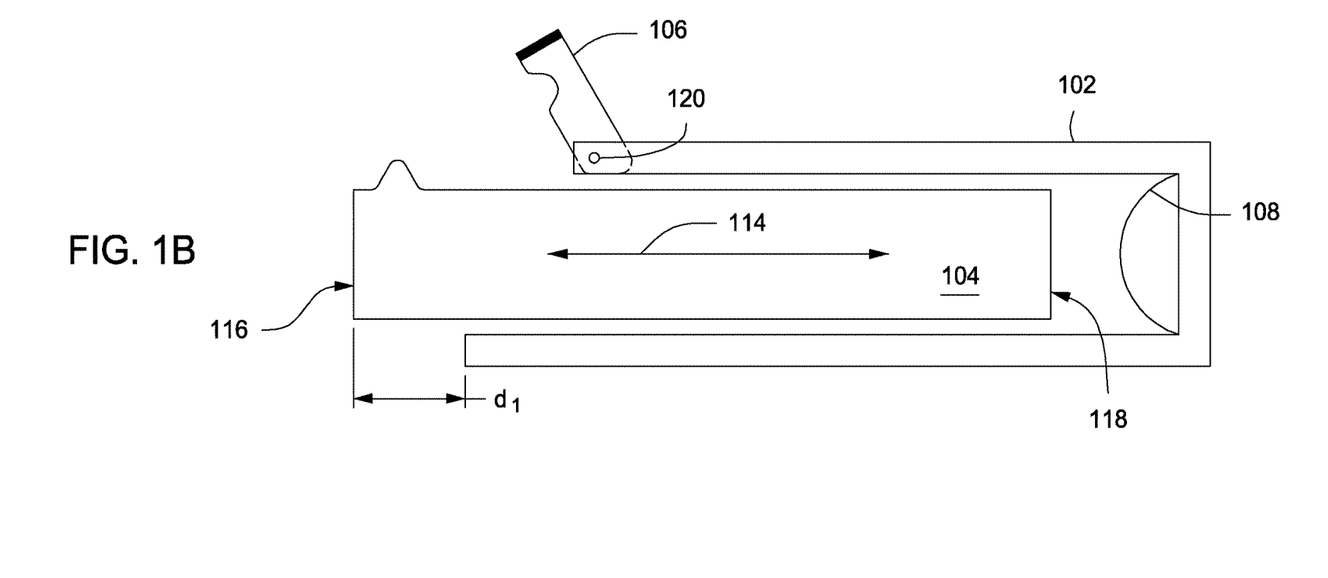
FIG. 1B is a sectional side view of the example latching system of FIG. 1 with the handle in the unlatched position.

FIG. 1B is a sectional side view of the example latching system of FIG. 1 with the handle in the unlatched position. The handle latch 106 has been rotated into the second position, thereby releasing the handle 104. In some examples the handle latch 106 may be biased towards the first position, for example by a spring. The leaf spring 108 has forced the handle 104 along the axis of motion 114 into the unlatched position. In the unlatched position the front face 116 of the handle 104 extends beyond the front edge of the frame 102 by distance d1. In some examples distance d1 is between ¼ of an inch and 1 inch, for example an inch.

Figure 2:
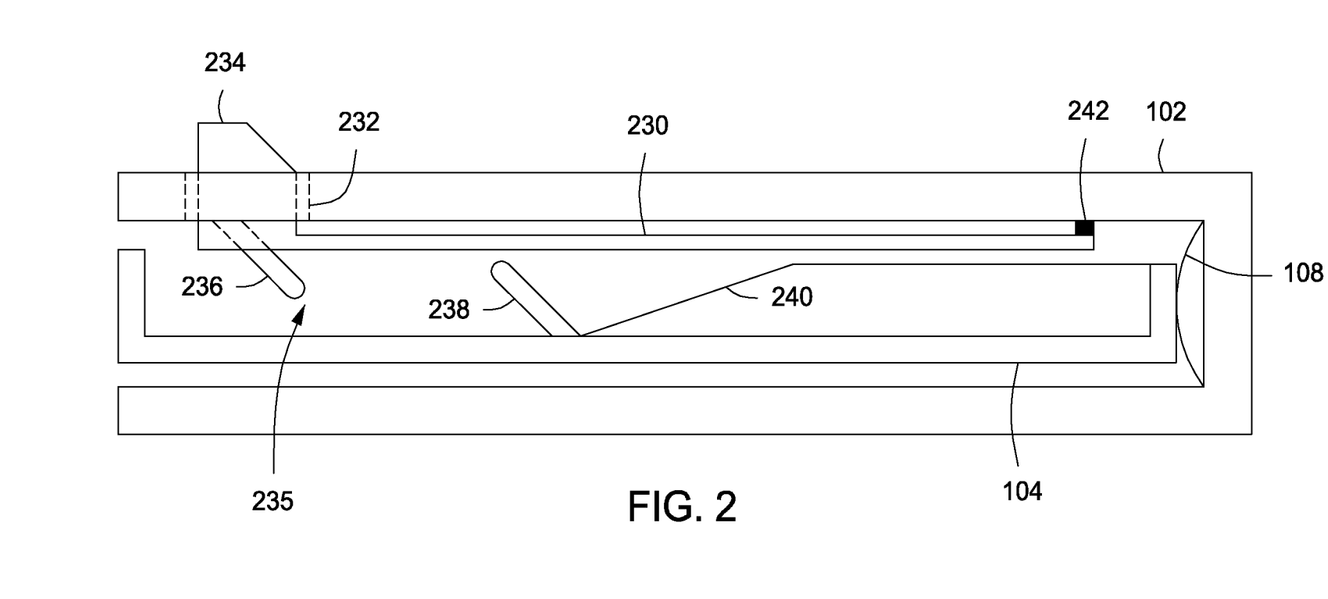
FIG. 2 is a sectional top view of the example latching system of FIG. 1.

Once the handle 104 is in the unlatched position, a user can grab the front of the handle 104 and pull it out to the engaged position. As the handle is moved from the unlatched position to the engaged position, an engagement feature (see FIG. 2A) on the handle 104 pulls the retention clip 230 into a recess in the handle 104.

FIG. 2 is a sectional top view of the example latching system of FIG. 1. In this view the retention clip 230 is located between the frame 102 and the handle 104. The back end 242 of the retention clip 230 is attached to the inside of the frame 102. In other examples the retention clip 230 and the leaf spring 108 may be combined into one part and may be attached to the frame in a different location. A locking tab 234 is Rimed on the front end of the retention clip 230. The locking tab 234 extends through an opening 232 in the frame 102.

When the latching system is installed into a mount inside a rack, the locking tab will extend through an opening in the mount and will lock the latching system into the mount. When the handle is in the latched position, the retention clip is free to bend or deflect towards the handle. This allows the latching system to be pushed into a mount in a rack.

Figure 3:
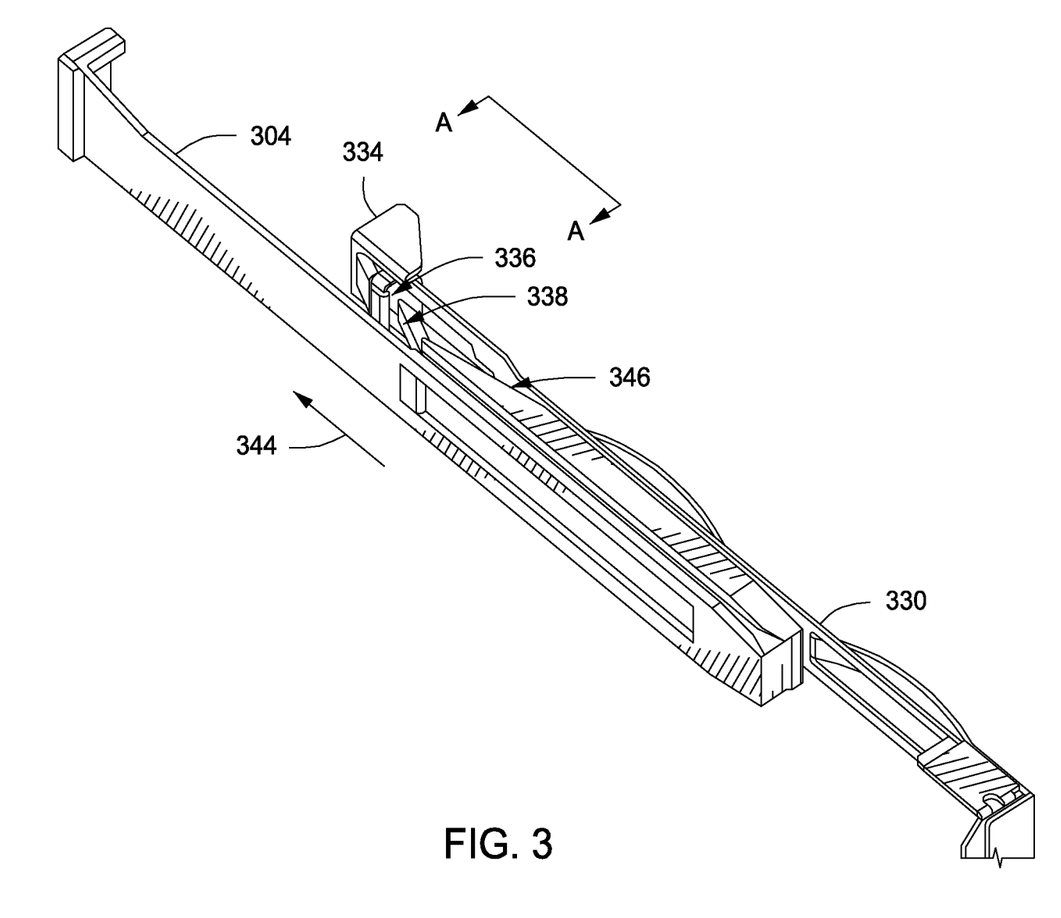
FIG. 3 is an isometric top view of an example handle and retention clip.

The handle 104 is shown in the latched position. An engagement feature 238 on the handle 104 will contact a matching engagement feature 236 on the retention clip 230 when the handle is moved from the unlatched position into the engaged position (see FIG. 3). When the handle 104 is in the engaged position the retention clip 230 will be bent towards the handle 104 with the locking tab 234 positioned in a recess or open area 235 in the handle 104. FIG. 3 is an isometric top view of an example handle and retention clip. The handle 304 has an engagement feature 338 extending out from the side of the handle 304 towards the retention clip 330. The retention clip 330 has a mating engagement feature 336 extending towards the handle 304.

In this view the handle 304 is shown in the unlatched position relative to the retention clip 330. In one example, When the handle 304 is in the unlatched position, the engagement feature 338 on the handle 304 has not engaged with the mating engagement feature 336 on the retention clip 330. Therefore the locking tab 334 will still be in an un-bent position. When the latching system is installed into a mount inside a rack, the locking tab will extend through an opening in the mount and will lock the latching system into the mount when the retention clip is in the un-bent condition. In other examples, when the handle 304 is in the unlatched position, the engagement feature 338 on the handle 304 may be partially engaged with the mating engagement feature 336 on the retention clip 330.

As the handle 304 is moved along the axis of motion in the direction shown by arrow 344, the engagement feature 338 on the handle 304 will mate with the engagement feature 336 on the retention clip 330 and will pull/bend the end of the retention clip towards the handle 304. The end of the retention clip will be pulled/bent in a direction generally perpendicular to the handle axis of motion. In this example, the engagement features on the handle 304 and the retention clip 330 are matching ramps or inclined planes. As the retention clip is bent towards the handle 304 it will be pulled against a support ramp 346 on the handle 304.

Figure 4A:
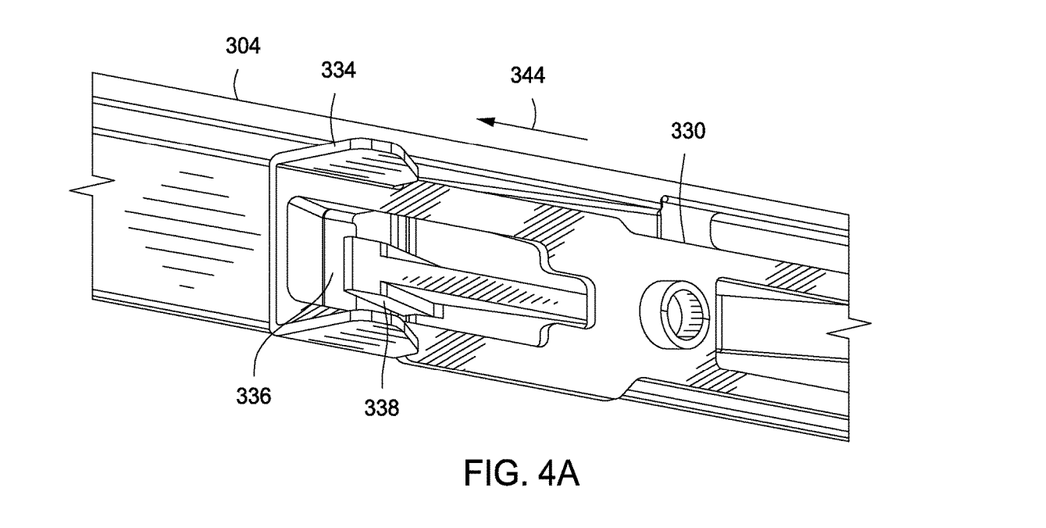
FIG. 4A is an isometric back view (view AA) from FIG. 3.
Figure 4B:
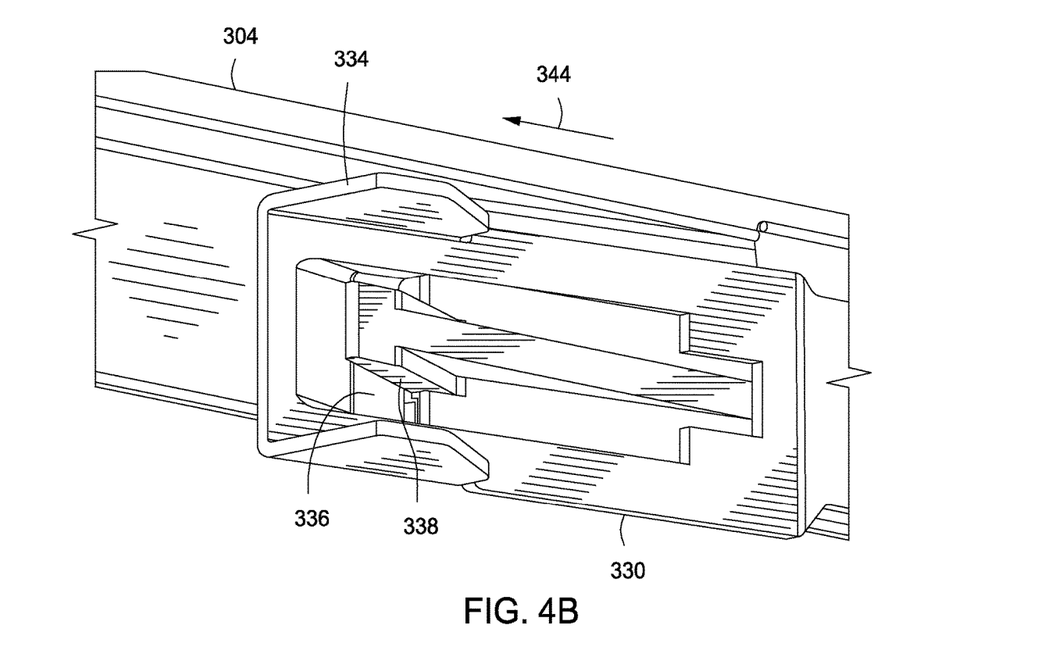
FIG. 4B is an isometric back view (view AA) from FIG. 3 with the example engagement features fully engaged.

FIG. 4A is an isometric back view (view AA) from FIG. 3. In this view the engagement feature 338 on the handle 304 is partially engaged with the mating engagement feature 336 on the retention clip 330. As the handle continues to move in the direction shown by arrow 344, the engagement feature 338 on the handle 304 will more filly engage with the mating engagement feature 336 on the retention clip 330. As the engagement features become more fully engaged, the retention clip will be pulled/bent closer to the handle 304. FIG. 4B is an isometric back view (view AA) from FIG. 3 with the engagement features fully engaged. When the engagement features are fully engaged the retention clip 330 will be against the support ramp 346 on the handle 304.

Figure 5:
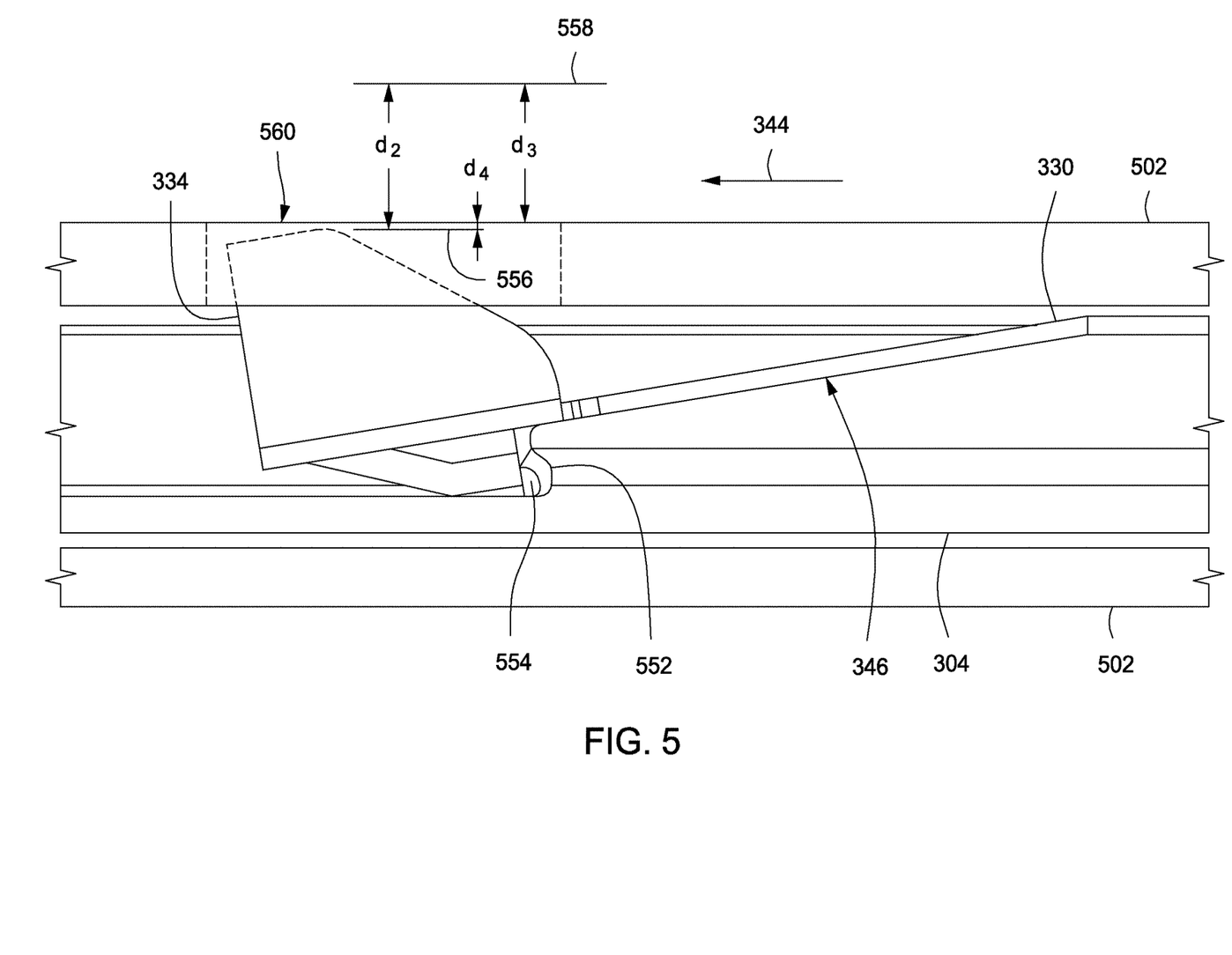
FIG. 5 is a top view of the example handle and retention clip from FIG. 3.

FIG. 5 is a top view of the example handle and retention clip from FIG. 3 inside a frame. This view shows the handle 304 in the engaged position. Therefore the retention clip 230 is in the unlocked position. When the handle 304 is in the engaged position, the engagement feature 338 on the handle 304 is fully engaged with the mating engagement feature 336 on the retention clip 330 (as shown in FIG. 4B). The retention clip 330 is also held against the supporting ramp 346 on the side of the handle 304 and the locking tab 334 is pulled into the recess or opening 235 in the handle 104 (see FIG. 2 for location of recess or opening 235 in handle).

The top surface of the locking tab 334 is at position 556 with respect to the outside surface 560 of the frame 502. When the handle is in the unlocked position the top surface of the locking tab 334 would be at position 558 with respect to the outside surface 560 of the flame. The distance between position 556 and position 558 is distance d2. In one example distance d2 is between 3.0 mm and 4.0 mm, for example 3.5 mm.

When the handle 304 is in the engaged position (as shown), the top surface of the locking tap 334 is distance d4 below the outside surface 560 of the frame 502. In one example distance d4 is between 0 and 0.5 mm. When distance d4 is zero, the top surface of the locking tab 4334 is flush with the outside surface 560 of the frame 502. When the handle 304 is disengaged (i.e. in the unlocked position), the top surface of the locking tap 334 extends beyond the outside surface 560 of the flame 502 by distance d3. In one example distance d3 is between 3.0 and 4.0 mm.

The handle 304 has a stop 552 that mates with the tip 554 of the engagement feature 336 on the retention clip 330. Once the stop 552 in the handle reaches the tip 554 of the engagement feature 336 on the retention clip 330, further movement of the handle 304 in the direction of arrow 344 will move the full latching system in that direction. Because the locking tab 334 is held in the handle recess 235 against the side of the handle 304 when the handle is in the engaged position, the latching system would be disengaged from any mount it was installed in. This allows the latching system, and any device it is attached to, to be pulled out of a mount by continuing to pull the handle in the direction of arrow 344.

Figure 6A:
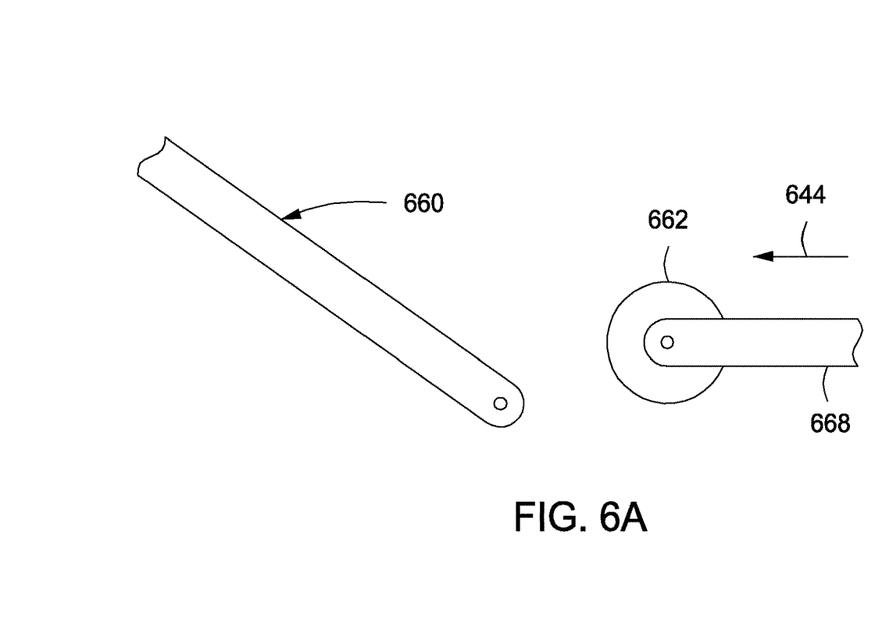
FIG. 6A is a partial view of an example engagement feature.

In the examples above, the engagement features on the handle and the retention clip are mating ramps or inclined planes. In other examples, other types of engagement features may be used. FIG. 6A is a partial view of an example engagement feature. The example engagement feature comprises an inclined plane 660 that would be attached to a retention clip (not shown) and a roller 662 attached to a mount 668 that would be coupled to the handle. As the handle is moved in the direction of arrow 644, the roller will contact the inclined plane 660 and pull the retention clips towards the handle.

Figure 6B:
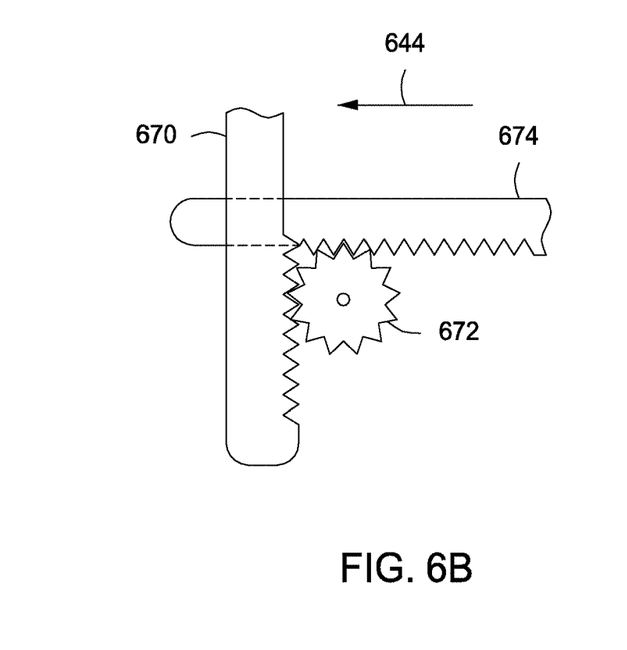
FIG. 6B is a partial view of another example engagement feature.

FIG. 6B is a partial view of another example engagement feature. This example engagement feature comprises a first gear rack 670 that would be attached to a retention clips (not shown) a gear 672 that would be mounted to the frame, and a second gear rack 674 that would be attached to a handle. As the handle is moved in the direction of arrow 644, the second gear rack would cause the gear to rotate. As the gear rotated, the first gear rack would move downward, perpendicular to the motion of the handle. As the first gear rack is moved downward (in this view), the retention clip would be pulled towards the handle. Other types of engagement features could also be used.

Figure 7:
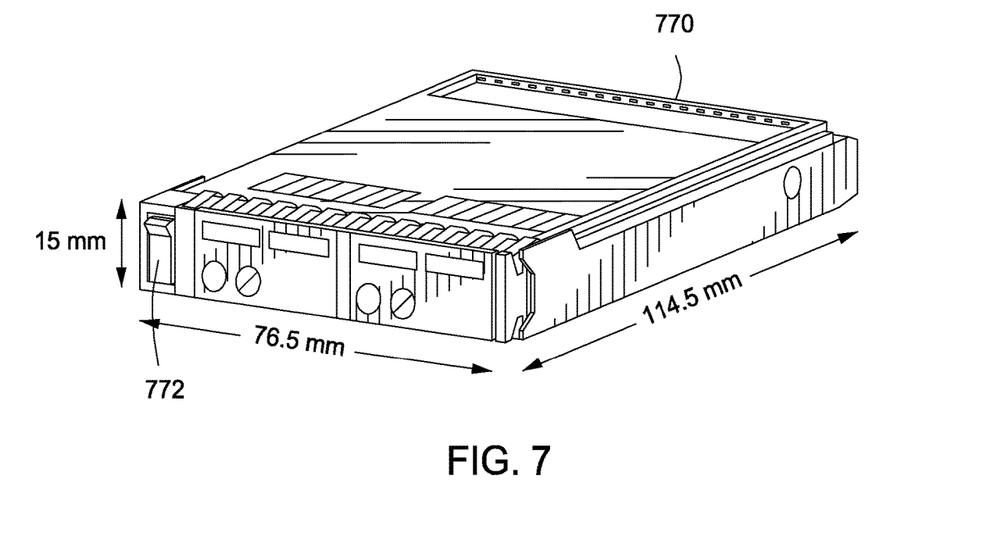
FIG. 7 is an isometric front view of an example device.

FIG. 7 is an isometric front view of an example device. The device 770 has an example latching system 772 attached to only one side of the device 770. The latching system may be the example latching system shown in FIG. 1. The handle is shown in the latched position. The device 770 with the latching system 772 attached may meet the dimensional requirements of the small form factor (SFF) hard drive mounting system used in many server racks. In this example the dimensions for the device 770 with the latching system attached are 114.5 mm deep, 15 mm high and 76.5 mm wide. In other examples the dimensions may be bigger or smaller. The device can be any type of device that is mounted into a rack of a server, for example a hard drive, memory card, solid state memory, processor blade, Input/Output (I/O) card, network card or the like.

What is claimed is:

1. A latching system, comprising:
   a frame;
   a handle, the handle mounted in the frame and movable along an axis of motion running between a front end and a back end of the handle;
   a handle latch attached to the frame and rotatable between a first position to hold the handle in a latched position and a second position, wherein the handle latch is disengaged from the handle in the second position;
   a spring attached to the frame, wherein the handle compresses the spring between the frame and the back end of the handle in the latched position and, as the handle latch moves from the latched position to an unlatched position, the spring to force the handle to move to the unlatched position;

a retention clip attached to the frame, the retention clip movable between a locked position and an unlocked position, wherein, as the retention clip is in the locked position, a top surface of a locking tab extends beyond an outside surface of the frame; and the handle having an engagement feature, the engagement feature moving the retention clip from the locked position into the unlocked position as the handle moves from the unlatched position into an engaged position.

2. The latching system of claim 1, where one end of the retention clip moves generally perpendicular to the axis of motion when the retention clip is moved from the locked position into the unlocked position.

3. The latching system of claim 1, where the engagement feature is an inclined plane that mates with a matching inclined plane on the retention clip.

4. The latching system of claim 1, wherein when the handle is in the latched position the front of the handle is flush with a front of the frame; and when the handle is in the unlatched position, the front of the handle extends beyond the front of the frame by between ¼ of an inch and 1 inch.

5. The latching system of claim 1, where the spring is a leaf spring and the leaf spring and the retention clip are integrated as one part.

6. The latching system of claim 1, wherein the latching system attaches to a side of a device to be mounted in a rack, and only one latching system is used to hold the device in the rack.

7. The latching system of claim 1, further comprising:
a locking tab at one end of the retention clip, where the locking tab is moved into a recess in the handle when the retention clip is moved from the locked position into the unlocked position.

8. The latching system of claim 7, wherein a top surface of the locking tab is flush with, or below, an outside surface of the frame when the retention clip is in the unlocked position.

9. The latching system of claim 1, wherein the latching system is attached to a device selected from the following list of devices: a hard drive, a memory card, a solid state memory, a processor blade, and an Input/Output (I/O) card.

10. A device, comprising:
a main frame having two sides;
a latching system, the latching system attached to one of the two sides of the main frame;
the latching system comprising:
a frame;
a handle, the handle mounted in the frame and movable along an axis of motion running between a front end and a back end of the handle, the handle movable between a latched position, an unlatched position and an engaged position, in order, along the axis of motion;
a handle latch attached to the frame and rotatable between a first position and a second position, when in the first position the handle latch holds the handle in the latched position, when in the second position the handle latch is disengaged from the handle;

a spring attached to the frame, the spring compressed between the frame and the back end of the handle when the handle is in the latched position, the handle forced to move to the unlatched position by the spring when the handle is in the latched position and the handle latch is rotated from the first position into the second position;

a retention clip attached to the frame, the retention clip movable between a locked position and an unlocked position, wherein a top surface of a locking tab extends beyond an outside surface of the frame when the retention clip is in the locked position; and the handle having an engagement feature, the engagement feature moving the retention clip from the locked position into the unlocked position as the handle moves from the unlatched position into the engaged position.

11. The device of claim 10, wherein the device fits in a small form factor (SFF) mount in a server.

12. The device of claim 10, where one end of the retention clip moves generally perpendicular to the axis of motion when the handle is moved from the latched position into the unlatched position.

13. The device of claim 10, wherein when the handle is in the latched position the front of the handle is flush with a front of the device; and when the handle is in the unlatched position, the front of the handle extends beyond the front of the device by between ¼ of an inch and 1 inch.

14. A method of manufacturing a latching system, comprising:
providing a frame;
mounting a handle in the frame, the handle movable along an axis of motion running between a front end and a back end of the handle, the handle movable between a latched position, an unlatched position and an engaged position, in order, along the axis of motion;
mounting a handle latch to the frame, the handle latch rotatable between a first position and a second position, when in the first position the handle latch holds the handle in the latched position, when in the second position the handle latch is disengaged from the handle;
attaching a spring to the frame, the spring compressed between the frame and the back end of the handle when the handle is in the latched position, the handle forced to move to the unlatched position by the spring when the handle is in the latched position and the handle latch is rotated from the first position into the second position;
attaching a retention clip to the frame, the retention clip movable between a locked position and an unlocked position, wherein a top surface of a locking tab extends beyond an outside surface of the frame when the retention clip is in the locked position; and
the handle having an engagement feature, the engagement feature moving the retention clip from the locked position into the unlocked position as the handle moves from the unlatched position into the engaged position.

* * * * *